(12) United States Patent
Agan et al.

(10) Patent No.: US 12,021,522 B2
(45) Date of Patent: *Jun. 25, 2024

(54) QUASI-ADIABATIC LOGIC CIRCUITS

(71) Applicant: TACHO HOLDINGS, LLC, St. Louis Park, MN (US)

(72) Inventors: Tommy Allen Agan, Maple Grove, MN (US); James John Lupino, St. Louis Park, MN (US)

(73) Assignee: TACHO HOLDINGS, LLC, St. Louis Park, MN (US)

( * ) Notice: Subject to any disclaimer, the term of this patent is extended or adjusted under 35 U.S.C. 154(b) by 253 days.

This patent is subject to a terminal disclaimer.

(21) Appl. No.: 17/645,310

(22) Filed: Dec. 20, 2021

(65) Prior Publication Data

US 2022/0116039 A1    Apr. 14, 2022

Related U.S. Application Data

(63) Continuation-in-part of application No. 17/053,770, filed as application No. PCT/US2019/031338 on May 8, 2019, now Pat. No. 11,206,021.

(60) Provisional application No. 62/668,259, filed on May 8, 2018.

(51) Int. Cl.
*H03K 19/00* (2006.01)
*H03K 19/0948* (2006.01)

(52) U.S. Cl.
CPC ..... *H03K 19/0019* (2013.01); *H03K 19/0948* (2013.01)

(58) Field of Classification Search
None
See application file for complete search history.

(56) References Cited

U.S. PATENT DOCUMENTS

| | | | | |
|---|---|---|---|---|
| 5,701,093 A | * | 12/1997 | Suzuki | H03K 19/0019 326/98 |
| 2010/0073029 A1 | * | 3/2010 | Hong | H03K 19/096 326/98 |
| 2011/0121813 A1 | * | 5/2011 | Sato | H03K 19/0019 323/318 |

OTHER PUBLICATIONS

International Preliminary Report on Patentability and Written Report dated Nov. 10, 2020, received for corresponding PCT Application No. PCT/US2019/031338, 7 pages.

* cited by examiner

*Primary Examiner* — Jany Richardson
(74) *Attorney, Agent, or Firm* — Kinney & Lange, P.A.

(57) ABSTRACT

Apparatus and associated methods relate to quasi-adiabatic logic gates in which at least one supply terminal receives a periodic power signal. The quasi-adiabatic logic gate is configured to perform a specific logic function operative upon one or more input signals. When the quasi-adiabatic logic gate switches the output from one logic state to another logic state, the transient switching portion of the output signal substantially tracks the periodic supply signal. Such a periodic supply signal can be one that transitions gradually between low and high voltage levels. Such periodic supply signals results in a transient switching portion of the logic signal having lower frequency components than have traditional CMOS logic gate transients. The quasi-adiabatic logic gate has a periodic clock signal that is not in phase with the periodic power signal.

20 Claims, 9 Drawing Sheets

QUASI-ADIABATIC LOGIC CIRCUITS

CROSS-REFERENCE TO RELATED APPLICATION(S)

This application is a continuation in part of U.S. patent application Ser. No. 17/053,770, entitled "Quasi-Adiabatic Logic Circuits," filed Jul. 11, 2020, by James John Lupino and Tommy Allen Agan, which was a 371 national phase entry of PCT/US2019/031338, entitled "Quasi-Adiabatic Logic Circuits," filed Aug. 5, 2019, by James John Lupino and Tommy Allen Agan, which claimed priority to U.S. Provisional Application No. 62/668,259, entitled "Quasi-Adiabatic Logic and Circuitry," filed May 8, 2018, by James John Lupino and Tommy Allen Agan. Each of the above referenced applications is incorporated herein by reference in its entirety.

BACKGROUND

Conventional CMOS logic circuits are powered between two DC power buses. The CMOS logic circuits are configured to perform specific logic functions based on input signals received thereby. When the input signals change such that the output signal indicative of the logic function operating on such signals must change, the output rapidly changes states. Such rapid transient portions of the output signal can cause pulses of current with high peak magnitudes. Such high peak current magnitudes can cause the supplies to momentarily collapse. Furthermore, during the transient portions of switching, both pullup and pulldown circuitry can be conductively providing a path for current to flow directly from one supply to another supply. Such current is sometimes called crowbar current. Crowbar current is wasted, in that such current is not used to charge parasitic capacitance of the subsequent logic gates.

SUMMARY

Apparatus and associated methods relate to a quasi-adiabatic logic gate. The quasi-adiabatic logic gate includes first and second clock input terminals configured to receive complementary first and second periodic clock signals, respectively. The quasi-adiabatic CMOS logic gate includes one or more logic input terminals configured to receive one or more corresponding logic input signals. The quasi-adiabatic CMOS logic gate includes a logic output terminal configured to output a logic output signal. The quasi-adiabatic CMOS logic gate includes a pullup network including one or more pullup transistors configured to perform a pullup logic function. Each of the one or more pullup transistors of the pullup network has a control node coupled to a corresponding one of the logic input terminals. The pullup network is configured to modulate conductivity between a first supply node and an intermediate pullup node based on the pullup logic function that the pullup network is configured to perform and the logic input signals received on the logic input terminals. The quasi-adiabatic CMOS logic gate includes a pulldown network having one or more pulldown transistors configured to perform a pulldown logic function that is the complement of the pullup logic function performed by the pullup network. Each of the one or more pulldown transistors of the pulldown network has a control node coupled to a corresponding one of the logic input terminals. The pulldown network is configured to modulate conductivity between a second supply node and an intermediate pulldown node based on the pulldown logic function that the pulldown network is configured to perform and the logic input signals received on the logic input terminals. The quasi-adiabatic CMOS logic gate includes a pullup clocking transistor having a pullup control node coupled to the first clock terminal. The pullup clocking transistor has a control node coupled to the first clock input terminal. The pullup clocking transistor is configured to modulate conductivity, based on the first periodic clock signal received on the first clock terminal, between the intermediate pullup node and a logic output terminal. The quasi-adiabatic CMOS logic gate includes a pulldown clocking transistor having a pulldown control node coupled to the second clock terminal. The pulldown clocking transistor has a control node coupled to the second clock input terminal. The pulldown clocking transistor is configured to modulate conductivity, based on the second periodic clock signal received on the second clock terminal, between the intermediate pulldown node and a logic output terminal. The first supply node is periodically driven by a first supply signal in a lagging phase relation with the second periodic clock signal. The second supply node is periodically driven by a second supply signal in a lagging phase relation with and the first clock signal.

DETAILED DESCRIPTION

Apparatus and associated methods relate to quasi-adiabatic logic gates in which at least one supply terminal receives a periodic power signal. The quasi-adiabatic logic gate is configured to perform a specific logic function operative upon one or more input signals. When the quasi-adiabatic logic gate switches the output from one logic state to another logic state, the transient switching portion of the output signal substantially tracks the periodic supply signal. Such a periodic supply signal can be one that transitions gradually between low and high voltage levels. Such periodic supply signals results in a transient switching portion of the logic signal having lower frequency components than have traditional CMOS logic gate transients. The quasi-adiabatic logic gate has a periodic clock signal that is not in phase with the periodic power signal.

Figure 1:
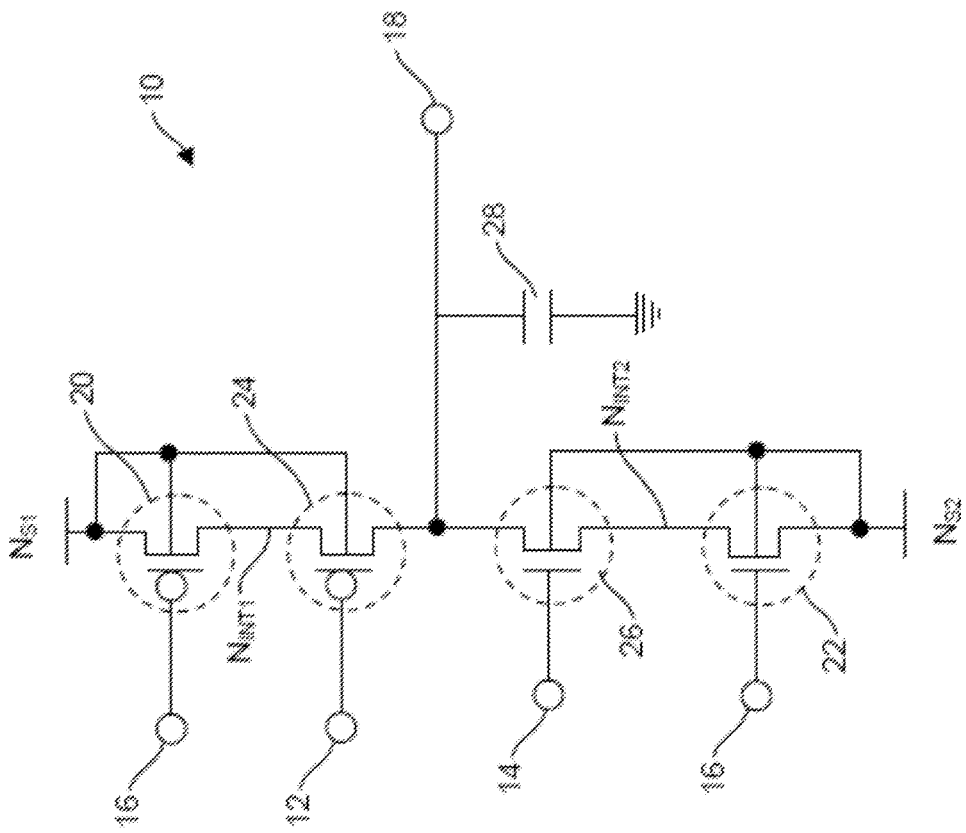
FIG. 1 is a schematic diagram of a quasi-adiabatic CMOS inverter.

FIG. 1 is a schematic diagram of a quasi-adiabatic CMOS inverter. In FIG. 1, quasi-adiabatic inverter 10 has first and second clock input terminals 12 and 14, logic input terminal 16, and logic output terminal 18. Quasi-adiabatic inverter 10 includes pullup network 20, pulldown network 22, pullup clocking device 24, and pulldown clocking device 26. Capacitor 28 can represent parasitic capacitances associated with logic output terminal 18, such as, for example, drain capacitances associated with pullup and pulldown clocking devices 24 and 26, metallization capacitances, and gate capacitances associated with logic gates connected to logic output terminal 18. Also depicted are complementary sinusoidal supplies 30 and 32.

Pullup network 20 and pulldown network 22 are simply a PMOS and NMOS Field Effect Transistor (FET), respectively. Such PMOS and NMOS devices are configured to provide an inverter logic function. Because logic gate 10 is configured to invert a logic signal, control nodes (e.g., gates of the PMOS and NMOS devices) for both pullup and pulldown networks 20 and 22 are conductively coupled to input logic terminal 16. For more complicated logic functions, pullup and pulldown networks 20 and 22 can include more than a single FET. For example, a two input NAND gate could be realized using two parallel connected NMOS FETs for pulldown network 22 and two series connected PMOS FETs for pullup network 20. Pullup and pulldown networks 20 and 22 are complementary, in that either one or the other, but not both, provides a conduction path between output terminal 18 and its respective supply node $N_{S1}$ or $N_{S2}$.

Pullup network 20 is configured to modulate conductivity between first supply node $N_{S1}$ and intermediate pullup node $N_{INT1}$ based on the pullup logic function that pullup network 20 is configured to perform and the logic input signals received on logic input terminal 16. Similarly, pulldown network 22 is configured to modulate conductivity between second supply node $N_{S2}$ and intermediate pulldown node $N_{INT2}$ based on the pulldown logic function that pulldown network 22 is configured to perform and the logic input signals received on logic input terminal 16.

Pullup clocking device 24 has a pullup control node (e.g., the gate of the depicted PMOS device) coupled to first clock input terminal 12. Pullup clocking device 24 is configured to modulate conductivity, based on a first sinusoidal clock signal received on first clock input terminal 12, between intermediate pullup node $N_{INT1}$ and logic output terminal 18. Pulldown clocking device 26 has a pulldown control node (e.g., the gate of the depicted NMOS device) coupled to second clock input terminal 14. Pulldown clocking device 26 is configured to modulate conductivity, based on a second sinusoidal clock signal received on second clock input terminal 14, between intermediate pulldown node $N_{INT2}$ and logic output terminal 18.

What renders the above described logic gate 10 a quasi-adiabatic logic gate is the non-DC supply signal applied to either or both of supply nodes $N_{S1}$ and $N_{S2}$. As depicted in FIG. 1, complementary sinusoidal supply signals are generated by complementary sinusoidal supplies 30 and 32. First supply node $N_{S1}$ is sinusoidally driven by a first supply signal in phase with the second sinusoidal clock signal received on second clock input terminal 14. In some embodiments, first supply node $N_{S1}$ can be conductively coupled to second clock input terminal 14. Second supply node $N_{S2}$ is sinusoidally driven by a second supply signal in phase with and the first clock signal received on first clock input terminal 12. In some embodiments, second supply node $N_{S2}$ can be conductively coupled to first clock input terminal 12.

In some embodiments the first and second supply signals can be complementary in that each of the first and second supply signals sinusoidally oscillate between the same DC voltage levels (e.g., VDD and VSS), but are approximately 180 degrees out of phase with one another. In some embodiments, only the first supply signal is non-DC. In other embodiments, only the second supply signal is non-DC. In some embodiments, first and second supply signals are sinusoids that are approximately 180 degrees out of phase with one another, but oscillate between voltage levels that are different for each of the first and second supply signals. For example the first supply signal can oscillate between VDD and a mid-level supply (e.g., the mean voltage between VDD and VSS). The second supply signal can then oscillate between the mid-level supply and VSS.

In some embodiments, the non-DC signal can be something other than sinusoidal. For example, in some embodiments, a non-DC signal can be created in a step-wise fashion. The stepwise signal can mimic a sinusoid or some other non-DC waveform. In some embodiments, a triangular or trapezoidal waveform can be used to provide power to quasi-adiabatic logic gates.

In some embodiments, the bodies of the devices of pullup network 20 and pullup clocking device 24 can be conductively coupled to first supply node $N_{S1}$ as depicted. In other embodiments, the bodies of the devices of pullup network 20 and pullup clocking device 24 can be conductively coupled to another biasing node. For example, the bodies of the devices of pullup network 20 and pullup clocking device 24 can be conductively coupled to VDD. In other embodiments the bodies of the devices of pullup network 20 and pullup clocking device 24 can be conductively coupled via diodes to both first supply node $N_{S1}$ and output logic terminal 18. Such a diode connection can ensure that the bodies of the devices of pullup network 20 and pullup clocking device 24 are not more than one diode voltage level below the voltage level of whichever of first supply node $N_{S1}$ and output logic terminal 18 that has the more positive voltage level.

Similarly, the bodies of the devices of pulldown network 22 and pulldown clocking device 26 can be conductively coupled via diodes to both second supply node $N_{S2}$ and output logic terminal 18. Such a diode connection can ensure that the bodies of the devices of pulldown network 22 and pulldown clocking device 26 are not more than one diode voltage level above the voltage level of whichever of second supply node $N_{S2}$ and output logic terminal 18 that has the more negative voltage level.

Figure 2:
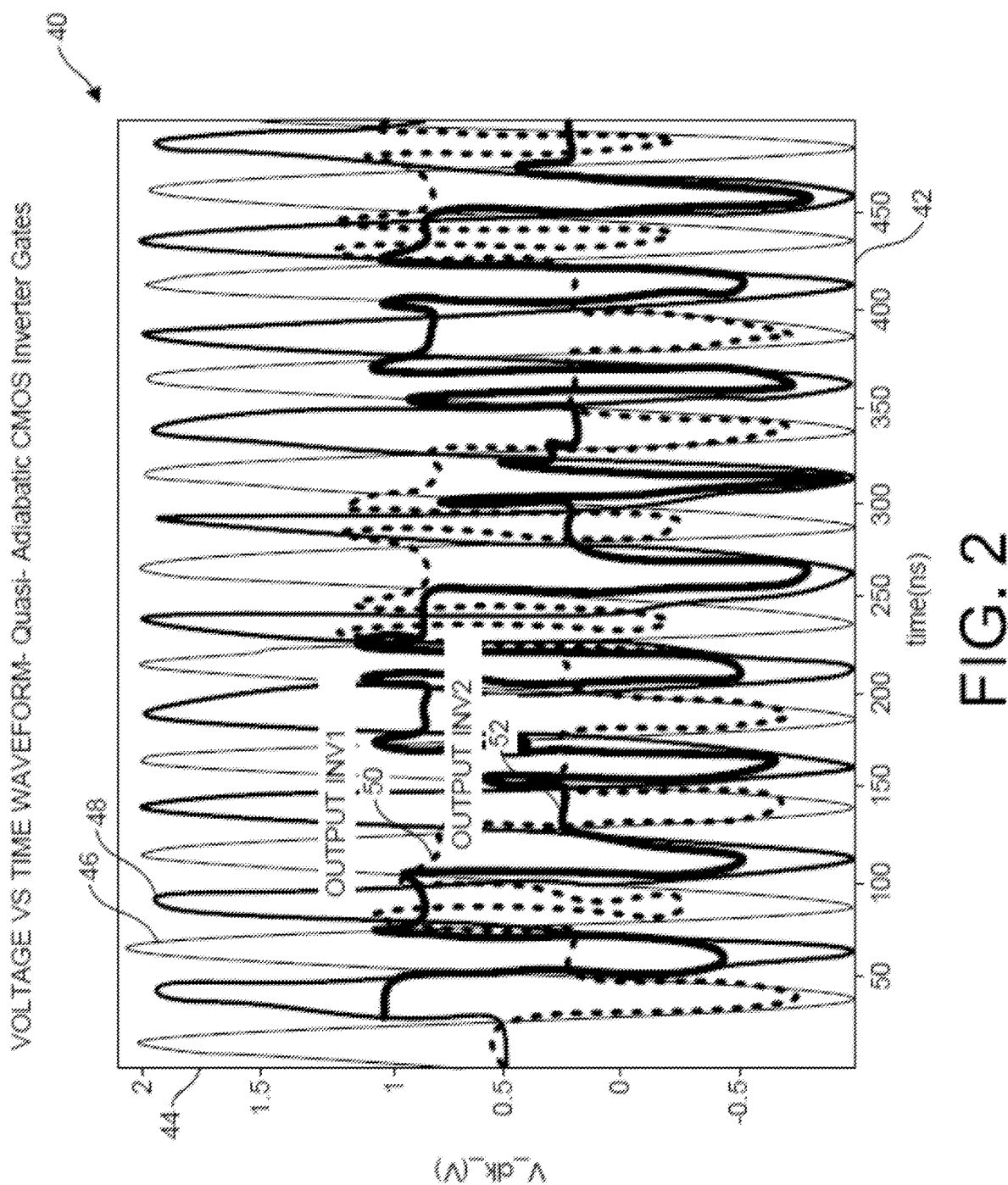
FIG. 2 is a graph of input and output signals of two series-connected quasi-adiabatic CMOS inverters, such as is depicted in FIG. 1.
Figure 6:
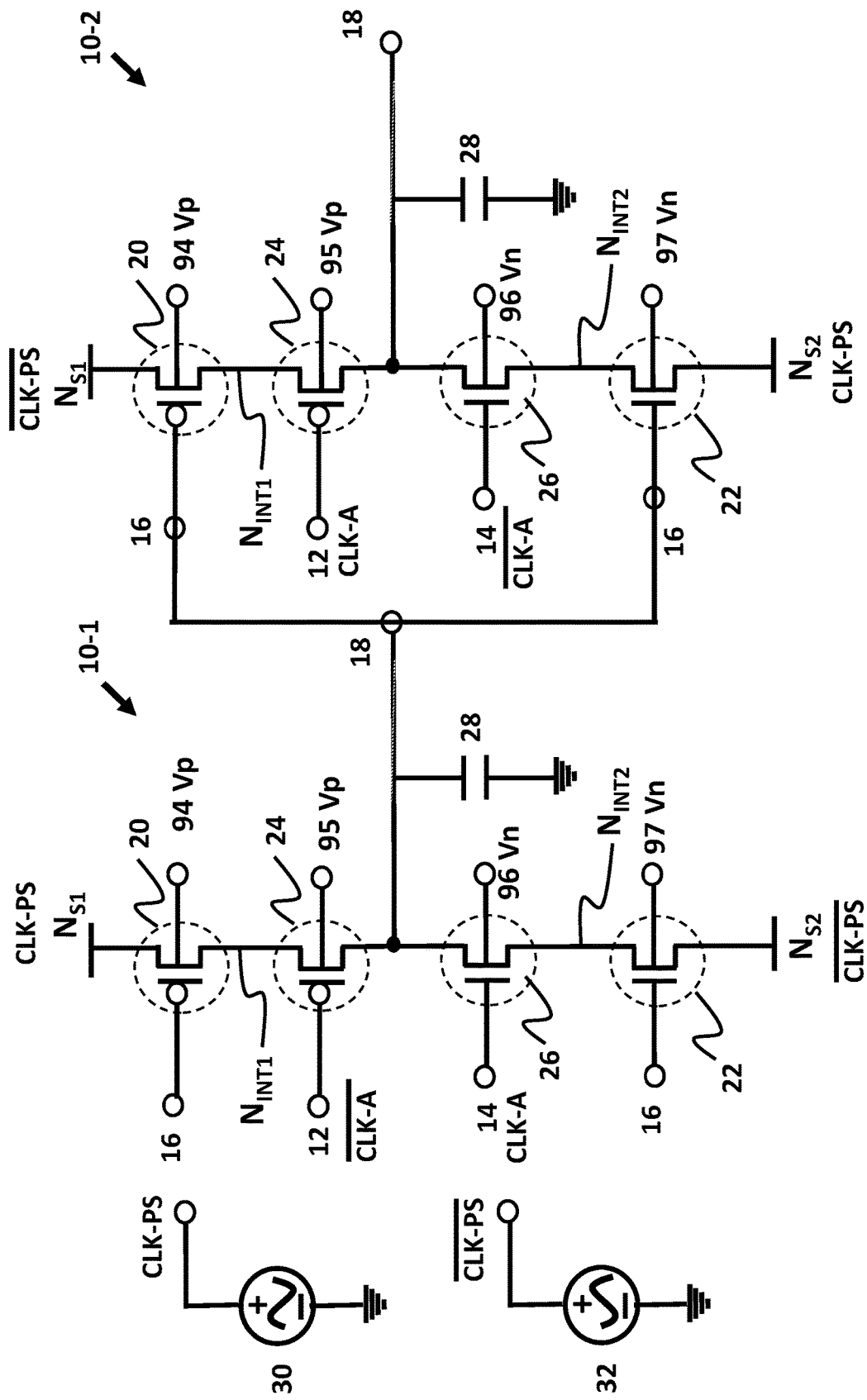
FIG. 6 is a schematic diagram of two quasi-adiabatic CMOS inverters connected in series.

FIG. 2 is a graph of input and output signals of two series-connected quasi-adiabatic CMOS inverters, such as is depicted in FIG. 1 and connected as shown in FIG. 6. Each of the two series-connected quasi-adiabatic CMOS inverters 10-1 and 10-2 are provided sinusoidal supply signals and sinusoidal clock signals that are out of phase with one another. For example, the first sinusoidal clock signal is provided to first clock terminal 12 of the first of the two series-connected quasi-adiabatic CMOS inverters, but to second clock terminal 14 of the second of the two series-connected quasi-adiabatic CMOS inverters. Conversely, the second sinusoidal clock signal is provided to second clock terminal 14 of the first of the two series-connected quasi-adiabatic CMOS inverters, but to first clock terminal 12 of the second of the two series-connected quasi-adiabatic CMOS inverters.

Similarly, the first supply signal is provided to first supply node $N_{S1}$ of the first of the two series-connected quasi-adiabatic CMOS inverters, but to second supply node $N_{S2}$ of the second of the two series-connected quasi-adiabatic CMOS inverters. Lastly, the second supply signal is provided to second supply node $N_{S2}$ of the first of the two series-connected quasi-adiabatic CMOS inverters, but to first supply node $N_{S1}$ of the second of the two series-connected quasi-adiabatic CMOS inverters. In this way, the second of the two series-connected quasi-adiabatic CMOS inverters transitions between logic states 180 degrees after the first of the two series-connected quasi-adiabatic CMOS inverters transitions between logic states.

In FIG. 2, graph 40 includes horizontal axis 42, vertical axis 44, and voltage/time relations 46, 48, 50 and 52. Horizontal axis 42 is indicative time, and vertical axis 44 is indicative of voltage. Voltage/time relation 46 is indicative of a first sinusoidal supply signal, that oscillates between VDD and VSS (2.0 volts and zero volts, respectively, in the graph depicted). Voltage/time relation 48 is indicative of a second sinusoidal supply signal, that oscillates between VDD and VSS. Voltage/time relations 46 and 48 are complementary in that they are 180 degrees out of phase with one another.

Voltage/time relation 50 is indicative of the output voltage of a first of the two series-connected quasi-adiabatic CMOS inverters. Voltage/time relation 52 is indicative of the output voltage of a second of the two series-connected quasi-adiabatic CMOS inverters. As is depicted in FIG. 2, the output logic signal indicated by voltage/time relation 50 is sufficient to cause the second of the series-connected quasi-adiabatic CMOS inverters to produce a proper output signal.

Figure 3:
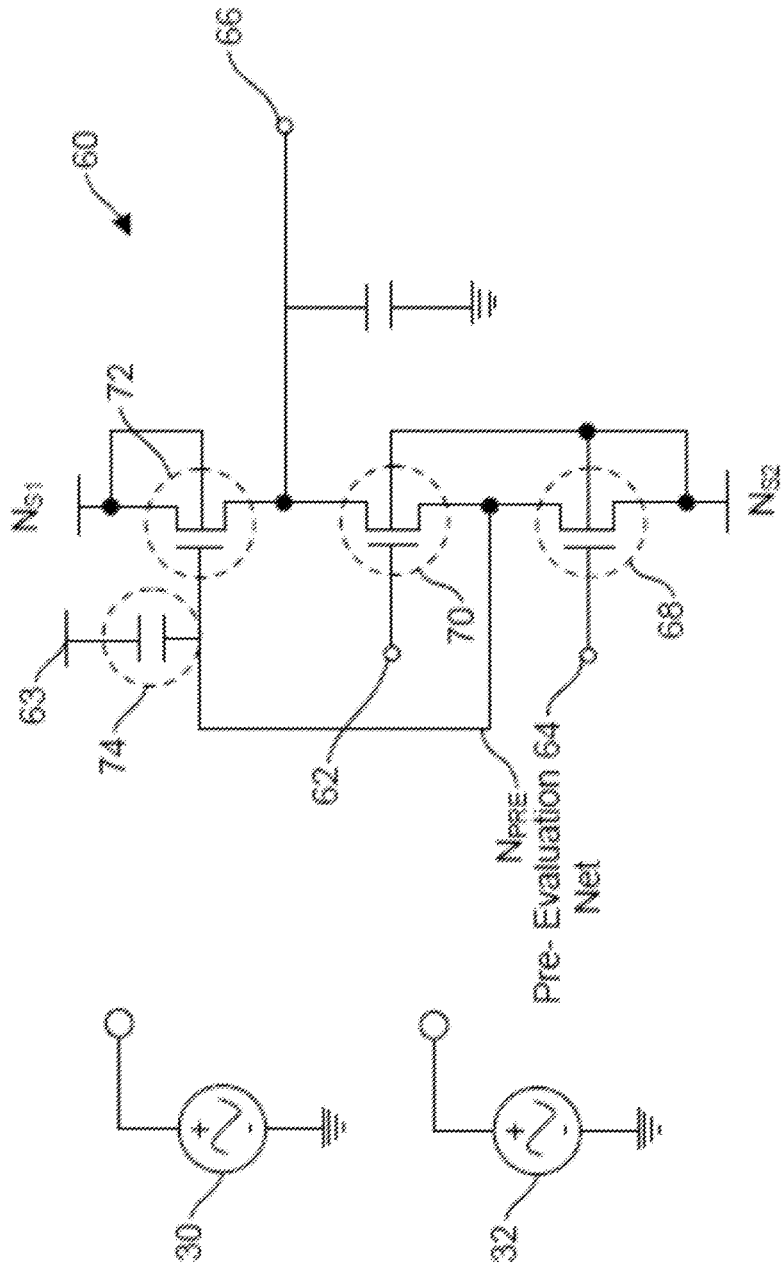
FIG. 3 is a schematic diagram of a quasi-adiabatic unipolar inverter.

FIG. 3 is a schematic diagram of a quasi-adiabatic unipolar inverter. In FIG. 3, inverter 60 includes clock input terminals 62 and 63, logic input terminal 64, and logic output terminal 66. First clock input terminal 62 is configured to receive a clock signal. Logic input terminal 64 is configured to receive a logic input signal of a binary logical nature. Logic output terminal 66 is configured to output a logic output signal of a binary logical nature. Inverter 60 also includes logic network 68 that, in the depicted embodiment (i.e. for an inverter) includes a single device of a unipolar type. Logic network 68 is configured to perform the inverter logic function. The devices of logical network 68 has a control node (e.g., gate) coupled to logic input terminal 64. Logic network 68 is configured to modulate conductivity, based on the configured logic function (e.g., inverter) and the logic input signal received on logic input terminal 64, between second supply node $N_{S2}$ (e.g., GND) and pre-evaluation net $N_{PRE}$. Also depicted are complementary sinusoidal supplies 30 and 32.

Inverter 60 includes logic clocking device 70 of the unipolar type having an input node (e.g., source/drain) coupled to pre-evaluation net $N_{PRE}$, a control node (e.g., gate) conductively coupled to first clock input terminal 62, and an output node (e.g., source/drain) coupled to logic output terminal 66. Logic clocking device 70 is configured to modulate conductivity, based on the received clock signal on first clock input terminal 62, between pre-evaluation net $N_{PRE}$ and logic output terminal 66.

Inverter 60 includes logic-complement clocking device 72 of the unipolar type having an input node (e.g., source/drain) coupled to first supply node $N_{S1}$ (e.g., VDD), a control node (e.g., gate) capacitively coupled, via capacitor 74, to second clock input terminal 63 and conductively coupled to pre-evaluation net $N_{PRE}$, and an output node (e.g., source/drain) coupled to logic output terminal 66, logic-complement clocking device 72 configured to modulate conductivity, based on the received clock signal on second clock input terminal 63, between second supply node $N_{S2}$ and logic output terminal 66.

In the depicted embodiment, pre-evaluation net $N_{PRE}$ can be charged to a voltage substantially above a voltage of second supply node $N_{S2}$ when the clock signal received on second clock input terminal 63 transitions from low to high and the conductivity of the logic network is low. If, however, the conductivity of the logic network is high or the clock signal received on second clock input terminal 63 transitions from high to low, the voltage of the pre-evaluation net will be not significantly above second supply node $N_{S2}$. If the unipolar type of the depicted devices 68, 70, and 72 is N-type, pre-evaluation net must have a voltage significantly above a voltage of second supply node $N_{S2}$ for logic-complement clocking device 72 to turn on and to provide a high conductivity path between first supply node $V_{S1}$ and logic output terminal 66.

What renders the above described logic gate 60 a quasi-adiabatic logic gate is the non-DC supply signal applied to either or both of supply nodes $N_{S1}$ and $N_{S2}$. As depicted in FIG. 3, complementary sinusoidal supply signals are generated by complementary sinusoidal supplies 30 and 32. First supply node $N_{S1}$ is sinusoidally driven by a first supply signal in phase with a first sinusoidal clock signal received on first clock input terminal 62. In some embodiments, first supply node $N_{S1}$ can be conductively coupled to first clock input terminal 62. Second supply node $N_{S2}$ is sinusoidally driven by a second supply signal in phase with the second clock signal received on second clock input terminal 63. In some embodiments, second supply node $N_{S2}$ can be conductively coupled to second clock input terminal 63.

In some embodiments the first and second supply signals can be complementary in that each of the first and second supply signals sinusoidally oscillate between the same DC voltage levels (e.g., VDD and VSS), but are approximately 180 degrees out of phase with one another. In some embodiments, only the first supply signal is non-DC. In other embodiments, only the second supply signal is non-DC. In some embodiments, first and second supply signals are sinusoids that are approximately 180 degrees out of phase with one another, but oscillate between voltage levels that are different for each of the first and second supply signals. For example the first supply signal can oscillate between VDD and a mid-level supply (e.g., the mean voltage between VDD and VSS). The second supply signal can then oscillate between the mid-level supply and VSS.

In some embodiments, the first and second clock signals provided to first and second clock terminals 62 and 63, respectively will oscillate between VDD and VSS, while the first and second supply signals will oscillate between the mid-level supply and the respective supply voltage VDD or VSS.

In some embodiments, the bodies of one or more of unitary devices 68, 70 and 72 can be conductively coupled to second supply node $N_{S2}$ or $N_{S1}$ as depicted. In other embodiments, the bodies of unitary devices 68, 70 and 72 can be conductively coupled to another biasing node. For example, the bodies of unitary devices 68, 70 and 72 can be conductively coupled to VSS. In other embodiments, unitary devices 68, 70 and 72 can be conductively coupled via diodes to both second supply node $N_{S2}$ and output logic terminal 18. Such a diode connection can ensure that the bodies of the devices of pulldown network 22 and pulldown clocking device 26 are not more than one diode voltage level above the voltage level of whichever of second supply node $N_{S2}$ and output logic terminal 18 that has the more negative voltage level.

Figure 4:
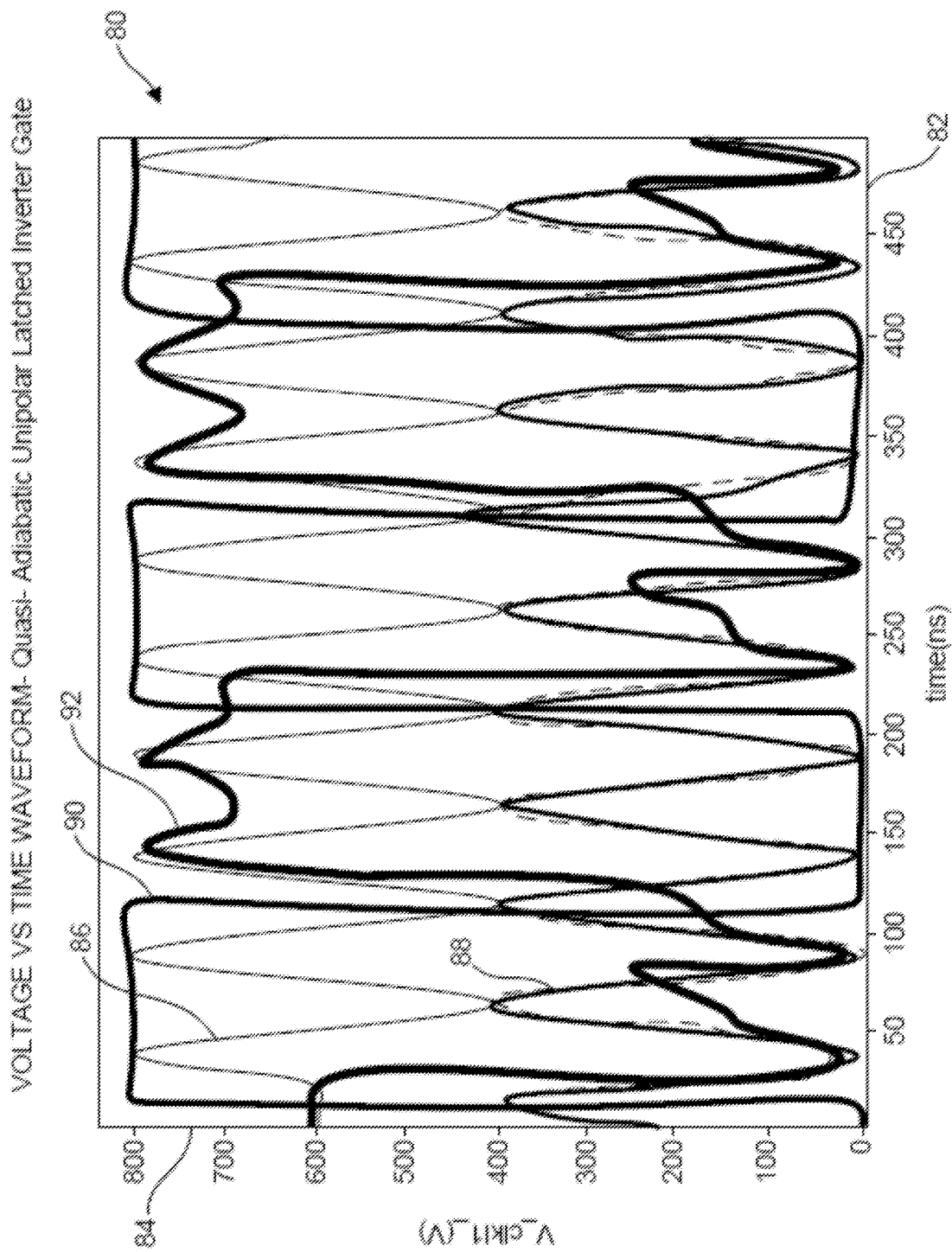
FIG. 4 is a graph of input and output signals of two series connected quasi-adiabatic unipolar inverters, such as is depicted in FIG. 37.

FIG. 4 is a graph of input and output signals of a quasi-adiabatic unipolar inverter, such as is depicted in FIG.

Figure 7:
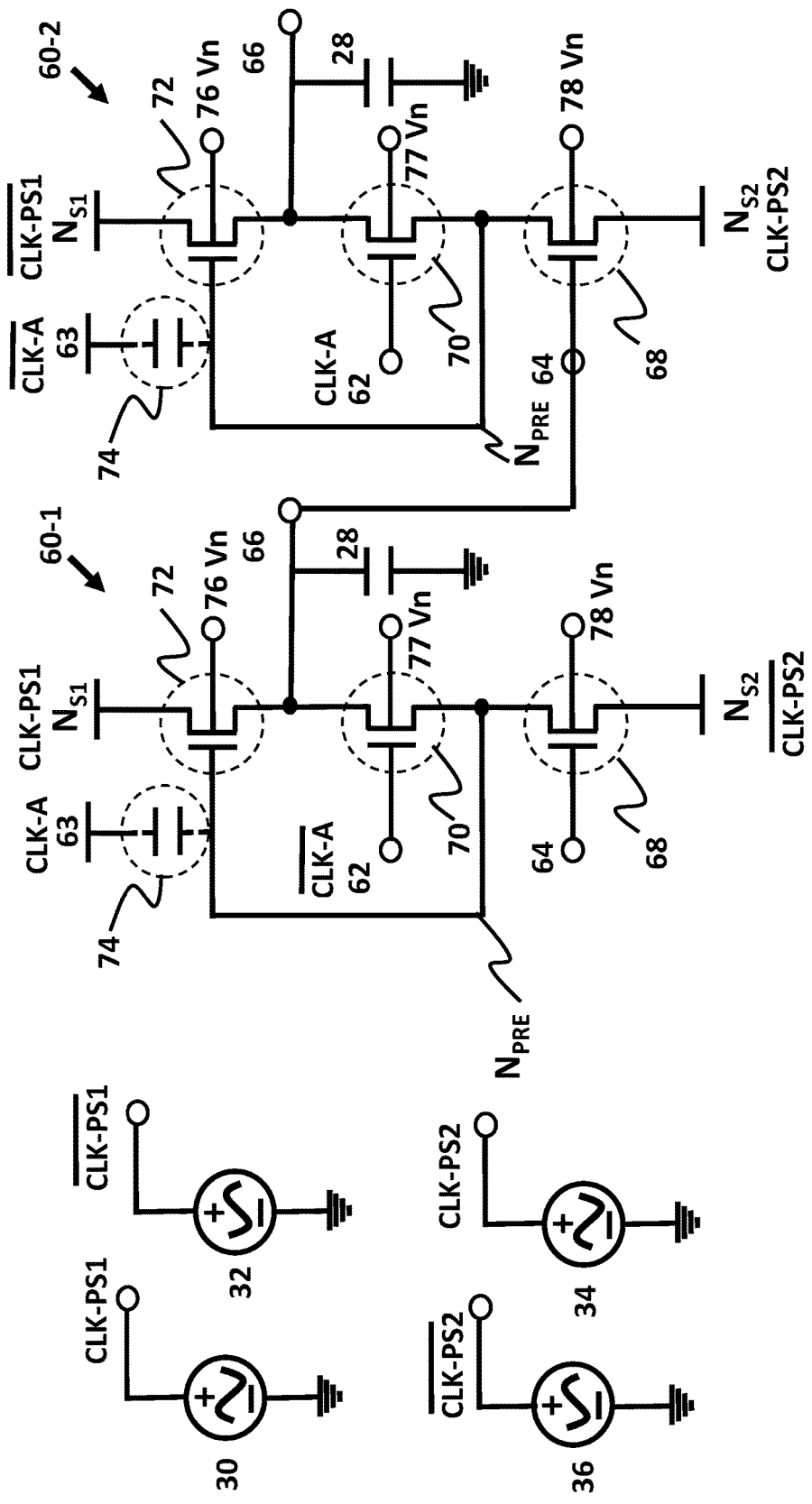
FIG. 7 is a schematic diagram of two quasi-adiabatic unipolar inverters connected in series.

3, and connected as shown in FIG. 7. As was the case for the two series-connected adiabatic CMOS inverters above, series-connected quasi-adiabatic unipolar inverters 60-1 and 60-2 are alternately provided sinusoidal supply signals that are complementary to adjacent logic gates. For example, the first sinusoidal clock signal is provided to first clock terminal 62 of a first of two series-connected quasi-adiabatic unipolar inverters, but to second clock terminal 63 of a second of the two series-connected quasi-adiabatic unipolar inverters. Conversely, the second sinusoidal clock signal is provided to second clock terminal 63 of the first of the two series-connected quasi-adiabatic unipolar inverters, but to first clock terminal 62 of the second of the two series-connected quasi-adiabatic unipolar inverters.

Similarly, the first supply signal is provided to first supply node $N_{S1}$ of the first of the two series-connected quasi-adiabatic unipolar inverters, but to second supply node $N_{S2}$ of the second of the two series-connected quasi-adiabatic unipolar inverters. Lastly, the second supply signal is provided to second supply node $N_{S2}$ of the first of the two series-connected quasi-adiabatic unipolar inverters, but to first supply node $N_{S1}$ of the second of the two series-connected quasi-adiabatic unipolar inverters. In this way, the second of the two series-connected quasi-adiabatic unipolar inverters transitions between logic states 180 degrees after the first of the two series-connected quasi-adiabatic unipolar inverters transitions between logic states.

In FIG. 4, graph 80 includes horizontal axis 82, vertical axis 84, and voltage/time relations 86, 88, 90 and 92. Horizontal axis 82 is indicative time, and vertical axis 84 is indicative of voltage. Voltage/time relation 86 is indicative of a first sinusoidal supply signal, that oscillates between VDD and mid-level voltage (0.8 volts and 0.4 volts, respectively, in the graph depicted). Voltage/time relation 88 is indicative of a second sinusoidal clock signal, that oscillates between mid-level voltage and VSS. Voltage/time relations 86 and 88 are complementary in that they are 180 degrees out of phase with one another, even though they oscillate between different voltage levels from one another.

Voltage/time relation 90 is indicative of the logic input voltage of quasi-adiabatic unipolar inverter. Voltage/time relation 92 is indicative of the output voltage of the quasi-adiabatic unipolar inverter. As is depicted in FIG. 4, the output logic signal indicated by voltage/time relation 50 is sufficient to cause any subsequently-connected quasi-adiabatic unipolar inverters to produce a proper output signal.

Figure 5:
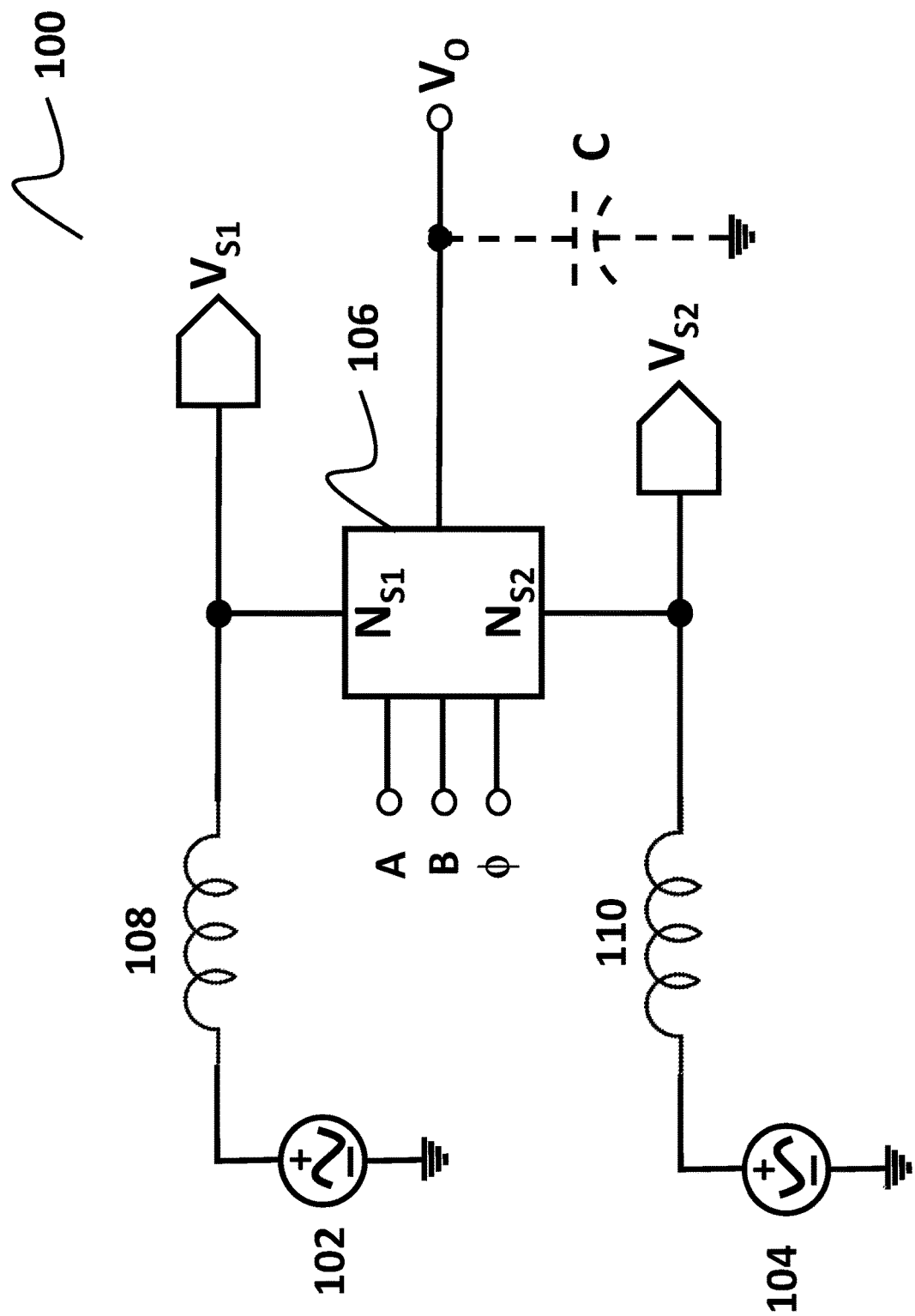
FIG. 5 is a schematic diagram depicting sinusoidally driven power provided to a quasi-adiabatic logic gate via inductors.

FIG. 5 is a schematic diagram depicting sinusoidally driven power provided to a quasi-adiabatic logic gate via inductors. In FIG. 5, adiabatic system 100 includes first sinusoidal power generator 102, second sinusoidal power generator 104, logic circuitry 106, and inductors 108 and 110. Logic circuitry 106 has first and second supply nodes $N_{S1}$ and $N_{S2}$, logic input terminals A and B, clock input terminal φ, and logic output terminal $V_O$. First and second sinusoidal power generators generate power that is out of phase with one another. Such complementary power signals are provided to logic circuitry 106 via inductors 108 and 110. Inductors 108 and 110 effectively create a tank circuit with capacitance C, which represents the parasitic capacitance of all internal nodes that are switched in response to one or more clock signals provided to clock input terminal φ. Inductors 108 and 110 can be tuned to match capacitance C and the switching frequency of the one or more clock signals provided to clock input terminal φ, so as to conserve charge.

In some embodiments, only one inductor will be used to provide power to only one of first and second supply nodes $N_{S1}$ and $N_{S2}$. In some embodiments, capacitance C and/or inductors 108 and 110 can be tuned so as to minimize power consumption of adiabatic system 100.

FIG. 6 is a schematic diagram of two quasi-adiabatic CMOS inverters connected in series. In FIG. 6, each of quasi-adiabatic inverters 10-1 and 10-2 has first and second clock input terminals 12 and 14, logic input terminal 16, and logic output terminal 18. Each of quasi-adiabatic inverter 10-1 and 10-2 includes pullup network 20, pulldown network 22, pullup clocking device 24, and pulldown clocking device 26. Capacitors 28 can represent parasitic capacitances associated with logic output terminal 18, such as, for example, drain capacitances associated with pullup and pulldown clocking devices 24 and 26, metallization capacitances, and gate capacitances associated with logic gates connected to logic output terminal 18. Also depicted are complementary sinusoidal supplies 30 and 32.

Pullup networks 20 and pulldown networks 22 are simply PMOS and NMOS Field Effect Transistors (FET), respectively. Such PMOS and NMOS devices are configured to provide an inverter logic function. Because logic gates 10-1 and 10-2 are configured to invert a logic signal, control nodes (e.g., gates of the PMOS and NMOS devices) for both pullup and pulldown networks 20 and 22 are conductively coupled to input logic terminal 16. For more complicated logic functions, pullup and pulldown networks 20 and 22 can include more than a single FET. For example, a two input NAND gate could be realized using two parallel connected NMOS FETs for pulldown network 22 and two series connected PMOS FETs for pullup network 20. Pullup and pulldown networks 20 and 22 are complementary, in that either one or the other, but not both, provides a conduction path between output terminal 18 and its respective supply node $N_{S1}$ or $N_{S2}$ of each of quasi-adiabatic CMOS inverters 10-1 and 10-2. In such embodiments, the phase of the supply signals applied to quasi-adiabatic CMOS inverters 10-1 and 10-2 are 180 degrees out of phase with each other.

Pullup networks 20 are configured to modulate conductivity between first supply nodes $N_{S1}$ and intermediate pullup nodes $N_{INT1}$ based on the pullup logic function that pullup networks 20 are configured to perform and the logic input signals received on logic input terminals 16. Similarly, pulldown networks 22 are configured to modulate conductivity between second supply nodes $N_{S2}$ and intermediate pulldown nodes $N_{INT2}$ based on the pulldown logic functions that pulldown networks 22 are configured to perform and the logic input signals received on logic input terminal 16.

Pullup clocking devices 24 have a pullup control node (e.g., the gate of the depicted PMOS device) coupled to first clock input terminal 12. Pullup clocking devices 24 are configured to modulate conductivity, based on first sinusoidal clock signals received on first clock input terminals 12, between intermediate pullup nodes $N_{INT1}$ and logic output terminals 18. Pulldown clocking device 26 have a pulldown control node (e.g., the gate of the depicted NMOS device) coupled to second clock input terminals 14. Pulldown clocking devices 26 are configured to modulate conductivity, based on second sinusoidal clock signals received on second clock input terminals 14, between intermediate pulldown nodes $N_{INT2}$ and logic output terminals 18.

What renders the above-described logic gates 10-1 and 10-2 quasi-adiabatic logic gates is the non-DC supply signal applied to either or both of supply nodes $N_{S1}$ and $N_{S2}$. Above, with regard to FIGS. 1 and 3, the phases of the supply signals and the clock signals were described as in phase with each other. With regard to the FIGS. 6 and 8 embodiments, phase differences between the supply signals and the clock signals will be described. As in the embodiment depicted in FIG. 1, complementary sinusoidal supply signals are generated by complementary sinusoidal supplies 30 and 32. First supply node $N_{S1}$ of first quasi-adiabatic logic gate 10-1 is sinusoidally driven by first supply signal CLK-PS lagging in phase by a predetermined phase difference to the second sinusoidal clock signal CLK-A received on second clock input terminal 14. Second supply node $N_{S2}$ is sinusoidally driven by a second supply signal $\overline{\text{CLK-PS}}$, which is 180 degrees out of phase with first supply signal CLK-PS and lagging in phase by a predetermined phase difference to the second sinusoidal clock signal $\overline{\text{CLK-A}}$ received on first clock input terminal 12. Phase timing between the supply signals CLK-PS and $\overline{\text{CLK-PS}}$ and the clock signals CLK-A and $\overline{\text{CLK-A}}$ can be used to optimize the response time of quasi-adiabatic logic gates 10-1 and 10-2. Second quasi-adiabatic logic gate 10-2 has supply signals and clock signals that are 180 degrees out of phase with those used for quasi-adiabatic logic gate 10-1. Adjacent quasi-adiabatic logic gates are configured to receive such complementary supply signals and clocking signals. Thus, a series of series of logic gates will be provided power signals and clock signals in an alternating fashion, with first, third, fifth, etc. gates receiving power signals and clock signals in a first configuration and second, fourth, sixth, etc. gates receiving power signals and clock signals in a second configuration complementary to the first configuration.

The phase difference between the leading clock signals and the lagging supply signals can optimize response time of quasi-adiabatic logic gates 10-1 and 10-2. By advancing clock signals provided to clock input terminals 14 and 12, so as to lead supply signals provided to supply terminals $N_{S1}$ and $N_{S2}$, respectively, the response times of quasi-adiabatic logic gates 10-1 and 10-2 can be optimized. By advancing the clock signals provided to clock input terminals 14 and 12 with respect to the supply signals provided to supply terminals $N_{S1}$ and $N_{S2}$, pullup clocking device 24 and pulldown clocking device 26 can transition from sub-threshold operation to super-threshold operation more quickly than if the clock and supply signals are in phase with one another. Because of this, the output signal is presented at an earlier time, with regard to the supply signal, when the clock signal leads the supply signal within a range of leading phase-shift values. In some embodiments, a phase difference between the leading clock signals and their corresponding supply signals can be between 2 and 50% if a period. In other embodiments, such a phase difference can be between 5 and 30% or between 10 and 20%, for example.

In some embodiments, the first and second supply signals can be complementary in that each of the first and second supply signals sinusoidally oscillate between the same DC voltage levels (e.g., VDD and VSS), but are approximately 180 degrees out of phase with one another. In some embodiments, only the first supply signal is non-DC. In other embodiments, only the second supply signal is non-DC. In some embodiments, first and second supply signals are sinusoids that are approximately 180 degrees out of phase with one another, but oscillate between voltage levels that are different for each of the first and second supply signals. For example, the first supply signal can oscillate between VDD and a mid-level supply (e.g., the mean voltage between VDD and VSS). The second supply signal can then oscillate between the mid-level supply and VSS.

In some embodiments, the non-DC signal can be something other than sinusoidal. For example, in some embodiments, a non-DC signal can be created in a step-wise fashion or piecewise linear fashion. The stepwise or piecewise linear signal can mimic a sinusoid or some other non-DC waveform. In some embodiments, a triangular or trapezoidal waveform can be used to provide power to quasi-adiabatic logic gates.

In some embodiments, the bodies of the devices of pullup network 20 and pullup clocking device 24 can be conductively coupled to first supply node $N_{S1}$ as depicted. In other embodiments, the bodies of the devices of pullup network 20 and pullup clocking device 24 can be conductively coupled to another biasing node. For example, the bodies of the devices of pullup network 20 and pullup clocking device 24 can be conductively coupled to VDD. In other embodiments the bodies of the devices of pullup network 20 and pullup clocking device 24 can be conductively coupled via diodes to both first supply node $N_{S1}$ and output logic terminal 18. Such a diode connection can ensure that the bodies of the devices of pullup network 20 and pullup clocking device 24 are not more than one diode voltage level below the voltage level of whichever of first supply node $N_{S1}$ and output logic terminal 18 that has the more positive voltage level.

Similarly, the bodies of the devices of pulldown network 22 and pulldown clocking device 26 can be conductively coupled via diodes to both second supply node $N_{S2}$ and output logic terminal 18. Such a diode connection can ensure that the bodies of the devices of pulldown network 22 and pulldown clocking device 26 are not more than one diode voltage level above the voltage level of whichever of second supply node $N_{S2}$ and output logic terminal 18 that has the more negative voltage level.

Additional performance improvements can be achieved by optimizing the body bias of pullup network 20, pulldown network 22, pullup clocking device 24, and pulldown clocking device 26. PMOS devices of such networks can have bodies biased at voltages different than a voltage of first supply signal applied to first supply terminal $N_{S1}$. As the voltage of such body biasing increases with respect to the voltage of first supply signal applied to first supply terminal $N_{S1}$, the PMOS devices become more conductive. Therefore, the speed can improve when the biasing of such PMOS devices is of a voltage that exceeds the voltage of first supply signal. Similarly, as the voltage of body biasing decreases with respect to the voltage of second supply signal applied to second supply terminal $N_{Ss}$, NMOS devices of pulldown network 22 and pulldown clocking device 26 become more conductive.

Even further performance improvements can be made by increasing the supply voltages, with respect to the threshold voltages of the PMOS and NMOS devices. Quasi-adiabatic logic, as disclosed herein, can be operated at higher relative voltages (i.e., with respect to threshold voltages) than non-adiabatic logic, without incurring as much of a power cost. In some embodiments, a difference between the first and second DC voltages can be greater than two, five, of ten times a threshold voltage of the PMOS pullup and/or NMOS pulldown transistors.

FIG. 7 is a schematic diagram of two quasi-adiabatic unipolar inverters connected in series. In FIG. 7, each of inverters 60-1 and 80-2 includes clock input terminals 62 and 63, logic input terminal 64, and logic output terminal 66. Each of first clock input terminals 62 is configured to receive a clock signal. Each of logic input terminals 64 is configured to receive a logic input signal of a binary logical nature. Logic output terminals 66 are configured to output logic output signals of a binary logical nature. Each of inverters 60-1 and 60-2 also includes logic network 68 that, in the depicted embodiment (i.e. for an inverter) includes a single device of a unipolar type. Each of logic networks 68 is configured to perform the inverter logic function. The device of each of logical networks 68 has a control node (e.g., gate) coupled to logic input terminal 64. Each of logic networks 68 is configured to modulate conductivity, based on the configured logic function (e.g., inverter) and the logic input signal received on logic input terminal 64, between second supply node $N_{S2}$ (e.g., GND) and pre-evaluation net $N_{PRE}$. Also depicted are complementary sinusoidal supplies 30 and 32.

Each of inverters 60-1 and 60-2 includes logic clocking device 70 of the unipolar type having an input node (e.g., source/drain) coupled to pre-evaluation net $N_{PRE}$, a control node (e.g., gate) conductively coupled to first clock input terminal 62, and an output node (e.g., source/drain) coupled to logic output terminal 66. Logic clocking device 70 is configured to modulate conductivity, based on the received clock signal on first clock input terminal 62, between pre-evaluation net $N_{PRE}$ and logic output terminal 66.

Inverter 60 includes logic-complement clocking device 72 of the unipolar type having an input node (e.g., source/drain) coupled to first supply node $N_{S1}$ (e.g., VDD), a control node (e.g., gate) capacitively coupled, via capacitor 74, to second clock input terminal 63 and conductively coupled to pre-evaluation net $N_{PRE}$, and an output node (e.g., source/drain) coupled to logic output terminal 66, logic-complement clocking device 72 configured to modulate conductivity, based on the received clock signal on second clock input terminal 63, between second supply node $N_{S2}$ and logic output terminal 66.

In the depicted embodiment, pre-evaluation net $N_{PRE}$ can be charged to a voltage substantially above a voltage of second supply node $N_{S2}$ when the clock signal received on second clock input terminal 63 transitions from low to high and the conductivity of the logic network is low. If, however, the conductivity of the logic network is high or the clock signal received on second clock input terminal 63 transitions from high to low, the voltage of the pre-evaluation net will be not significantly above second supply node $N_{S2}$. If the unipolar type of the depicted devices 68, 70, and 72 is N-type, pre-evaluation net must have a voltage significantly above a voltage of second supply node $N_{S2}$ for logic-complement clocking device 72 to turn on and to provide a high conductivity path between first supply node $V_{S1}$ and logic output terminal 66.

What renders the above-described logic gates 60-1 and 60-2 quasi-adiabatic logic gates is the non-DC supply signal applied to either or both of supply nodes $N_{S1}$ and $N_{S2}$. As in the embodiment depicted in FIG. 3, complementary sinusoidal supply signals are generated by complementary sinusoidal supplies 30 and 32. First supply node $N_{S1}$ of quasi-adiabatic unipolar logic gate 60-1 is sinusoidally driven by first supply signal CLK-PS1 lagging in phase to first sinusoidal clock signal $\overline{\text{CLK-A}}$ received on first clock input terminal 62. Second supply node $N_{S2}$ is sinusoidally driven by second supply signal $\overline{\text{CLK-PS2}}$, which is 180 degrees out of phase with first supply signal CLK-PS1. Phase timing between such supply signals and clock signals can be used to optimize the response time of quasi-adiabatic logic gates 60-1 and 60-2. Second quasi-adiabatic logic gate 60-2 has supply signals and clock signals that are 180 degrees out of phase with those used for quasi-adiabatic logic gate 60-1. Adjacent quasi-adiabatic logic gates are configured to receive such complementary supply signals and clocking signals.

The phase difference between the leading clock signals and the lagging supply signals can optimize response time of quasi-adiabatic logic gates 60-1 and 60-2. By advancing clock signals provided to clock input terminal 62, so as to lead supply signals provided to $N_{S1}$, the response times of quasi-adiabatic logic gates 60-1 and 60-2 can be optimized. By advancing the clock signals provided to clock input terminal 62 with respect to the supply signal provided to $N_{S1}$, pulldown clocking device 70 goes from sub-threshold operation to super-threshold operation more quickly than if the clock and supply signals are in phase with one another. Because of this, the output signal is presented at an earlier time, with regard to the supply signal, when the clock signal leads the supply signal. In some embodiments, a phase difference between the leading clock signals and their corresponding supply signals can be between 2 and 50% if a period. In other embodiments, such a phase difference can be between 5 and 20% or between 10 and 20%, for example.

In some embodiments the first and second supply signals can be complementary in that each of the first and second supply signals sinusoidally oscillate between the same DC voltage levels (e.g., VDD and VSS), but are approximately 180 degrees out of phase with one another. In some embodiments, only the first supply signal is non-DC. In other embodiments, only the second supply signal is non-DC. In some embodiments, first and second supply signals are sinusoids that are approximately 180 degrees out of phase with one another, but oscillate between voltage levels that are different for each of the first and second supply signals. For example the first supply signal can oscillate between VDD and a mid-level supply (e.g., the mean voltage between VDD and VSS). The second supply signal can then oscillate between the mid-level supply and VSS.

In some embodiments, the first and second clock signals provided to first and second clock terminals 62 and 63, respectively will oscillate between VDD and VSS, while the first and second supply signals will oscillate between the mid-level supply and the respective supply voltage VDD or VSS.

In some embodiments, the bodies of one or more of unitary devices 68, 70 and 72 can be conductively coupled to second supply node $N_{S2}$ or $N_{S1}$ as depicted. In other embodiments, the bodies of unitary devices 68, 70 and 72 can be conductively coupled to another biasing node. For example, the bodies of unitary devices 68, 70 and 72 can be conductively coupled to VSS. In other embodiments, unitary devices 68, 70 and 72 can be conductively coupled via diodes to both second supply node $N_{S2}$ and output logic terminal 18. Such a diode connection can ensure that the bodies of the devices of pulldown network 22 and pulldown clocking device 26 are not more than one diode voltage level above the voltage level of whichever of second supply node $N_{S2}$ and output logic terminal 18 that has the more negative voltage level.

Figure 8:
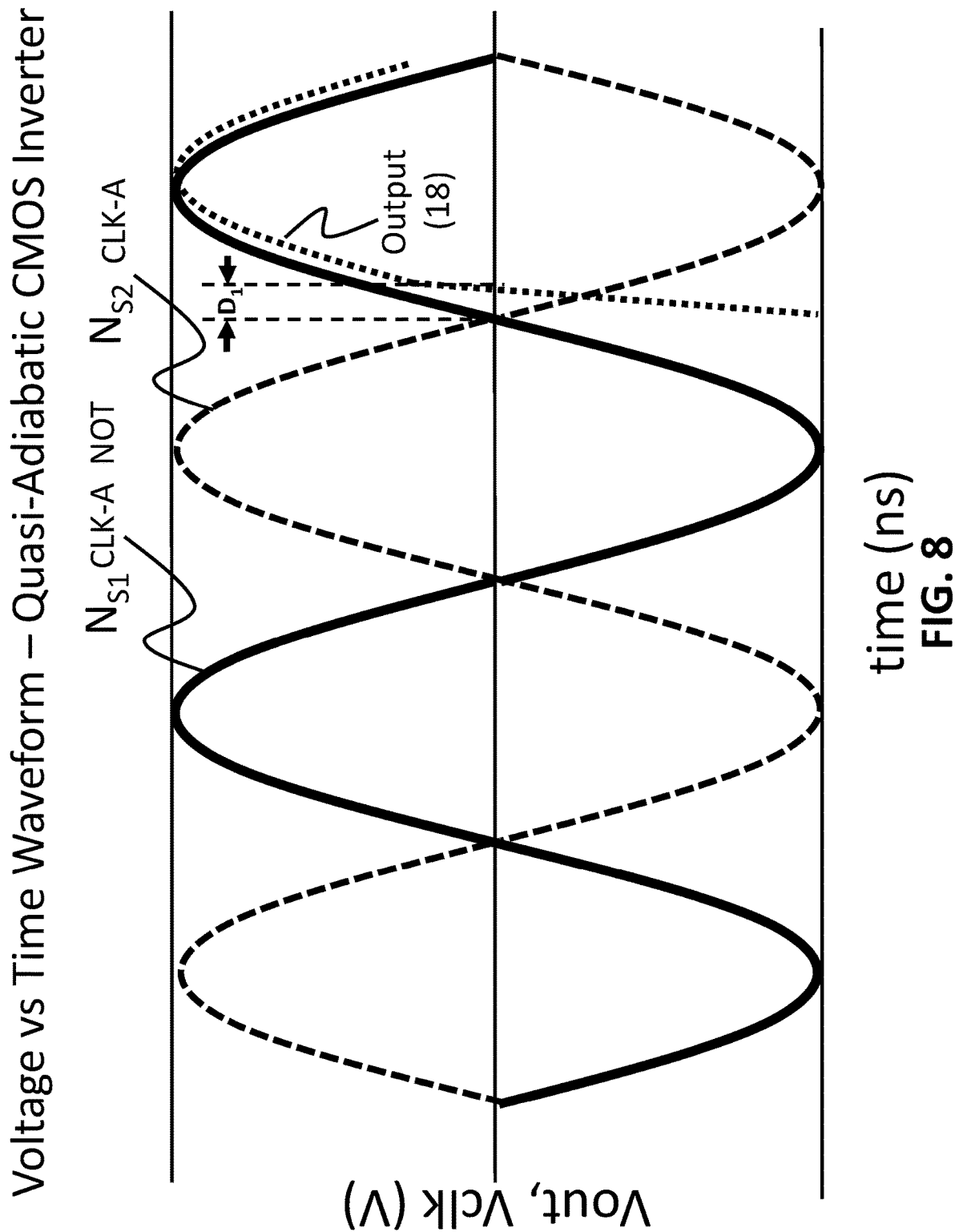
FIG. 8 is a graph of the input and output signals of a quasi-adiabatic CMOS inverter, such as is depicted in FIG. 1 and FIG. 6.

FIG. 8 is a graph of the input and output signals of a quasi-adiabatic CMOS inverter, such as is depicted in FIG. 1 and in FIG. 6. FIG. 8 is a graph of the simulated input and output signals of an embodiment created using a 130 nm process quasi-adiabatic CMOS inverter, such as is depicted in FIG. 1 and in FIG. 6. In such circuits, CLK-A and $N_{S1}$ can be identical (i.e., in phase with one another); additionally CLK-A NOT and $N_{S2}$ can be identical (i.e., in phase with one another). The waveforms depicted in FIG. 8 use such in-phase waveforms to show the resulting performance of such in-phase quasi-adiabatic logic where Vout is about 0.14 ns ($D_1$) after the $N_{S1}$ and $N_{S2}$ midpoints are located. The delay between input (e.g., clock) and output is due to the time it takes for the threshold voltages on the first and second pull-up transistors 20 and 24 increase enough to turn the transistors on. Furthermore, note that the voltage on the Output 18 does not match the voltage rise of $N_{S1}$ very well. Both output 18 and supply $N_{S1}$ are both going up, but $N_{S1}$ is delayed, requiring much more power. In this simulation, the voltage is sinusoidal between ground and 1V. It is the product of the current and the voltage between the two signals that determines the power required. Furthermore, the body bias voltages 94 and 95 on the pull up transistors 20 and 24 can be provided independent of the supply signals. Similarly, body bias voltages 96 and 97 on the pull-down transistors 22 and 26 can be independent. The body bias voltages 94, 95, 96 and 97, can be provided by a body biasing circuit.

Figure 9:
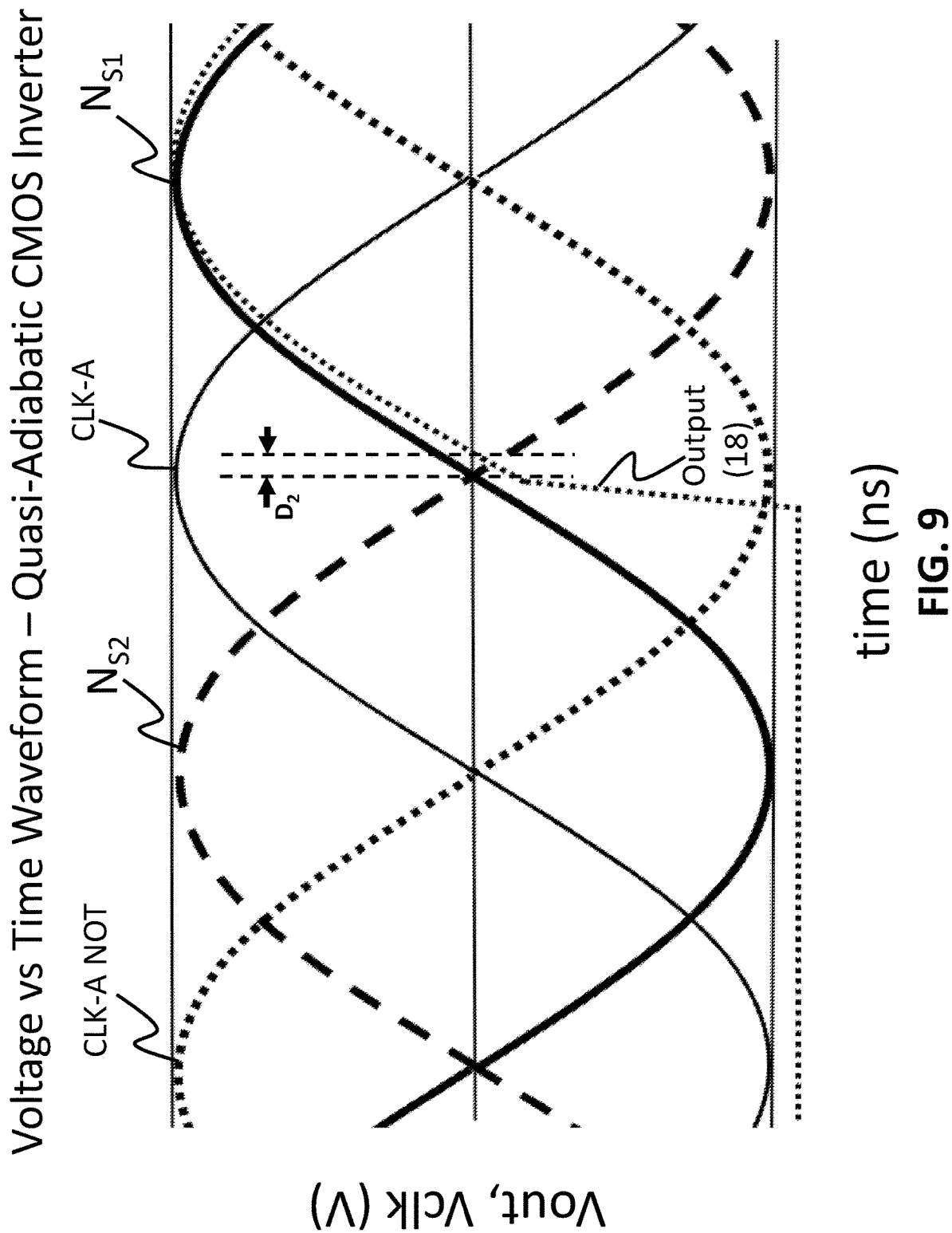
FIG. 9 is a graph of the input and output signals of a quasi-adiabatic CMOS inverter, such as is depicted in FIG. 1 and FIG. 6.

FIG. 9 is a graph of the input and output signals of a quasi-adiabatic CMOS inverter, such as is depicted in FIG. 1 and in FIG. 6. FIG. 9 is a graph of the simulated input and output signals of an embodiment created using a 130 nm process quasi-adiabatic CMOS inverter, such as is depicted in FIG. 1 and in FIG. 6. In this circuit, CLK-A and $N_{S1}$ are not identical to one another; additionally, CLK-A NOT and $N_{S2}$ are not identical to one another. This waveform shows the speed up from 3 different methods for increasing the speed of the Quasi-Adiabatic circuits. The first method is to lower the threshold voltage on the transistors 20, 24, 22, and 26. This can be accomplished by a body bias circuit attached to the body of the transistors. The second method is to move the timing on CLK-A and CLK-A NOT to precede the supply voltages on $N_{S1}$ and $N_{S2}$. This enables the signals to be "ready" to switch the Output 18 to match $N_{S1}$ or $N_{S2}$ depending on the value of the Input 16. The third method is to increase the maximum supply voltage across on $N_{S1}$ and $N_{S2}$. In this simulation, the voltage is sinusoidal between ground and 3V. This reduces the effect of the threshold voltage Vth on speed and power because Vth becomes a smaller percentage of the maximum power supply voltage difference. Note that from the crossover point of $N_{S1}$ and $N_{S2}$ the output signal crosses the midpoint only 0.025 ns ($D_2$) later. Also observe that the output signal and the trap signal match very closely as they both rise. Note that the power equation (i.e., P=V*I, Power=Voltage times Current) depends upon the difference of the voltage between those two signals. This has the effect of lowering the power in particular when the "VDD" is high. The power penalty for a higher voltage is almost completely eliminated while the speed increase is quite visible.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A quasi-adiabatic logic gate comprising:
 first and second clock input terminals configured to receive complementary first and second periodic clock signals, respectively;
 one or more logic input terminals configured to receive one or more corresponding logic input signals;
 a logic output terminal configured to output a logic output signal;
 a pullup network including one or more pullup transistors configured to perform a pullup logic function, each of the one or more pullup transistors of the pullup network having a control node coupled to a corresponding one of the logic input terminals, the pullup network configured to modulate conductivity between a first supply node and an intermediate pullup node based on the pullup logic function that the pullup network is configured to perform and the logic input signals received on the logic input terminals;
 a pulldown network including one or more pulldown transistors configured to perform a pulldown logic function that is the complement of the pullup logic function performed by the pullup network, each of the one or more pulldown transistors of the pulldown network having a control node coupled to a corresponding one of the logic input terminals, the pulldown network configured to modulate conductivity between a second supply node and an intermediate pulldown node based on the pulldown logic function that the pulldown network is configured to perform and the logic input signals received on the logic input terminals;
 a pullup clocking transistor having a pullup control node coupled to the first clock terminal, the pullup clocking transistor having a control node coupled to the first clock input terminal, the pullup clocking transistor configured to modulate conductivity, based on the first periodic clock signal received on the first clock terminal, between the intermediate pullup node and a logic output terminal;
 a pulldown clocking transistor having a pulldown control node coupled to the second clock terminal, the pulldown clocking transistor having a control node coupled to the second clock input terminal, the pulldown clocking transistor configured to modulate conductivity, based on the second periodic clock signal received on the second clock terminal, between the intermediate pulldown node and a logic output terminal;
 wherein the first supply node is periodically driven by a first supply signal in a lagging phase relation with the second periodic clock signal, and wherein the second supply node is periodically driven by a second supply signal in a lagging phase relation with and the first clock signal.

2. The quasi-adiabatic logic gate of claim 1, wherein the phase relation between the first supply signal and the second clock signal is one in which the second clock signal leads the first supply signal by between 2% and 50% of a period of the periodically driven first supply signal.

3. The quasi-adiabatic logic gate of claim 2, wherein the phase relation between the first supply signal and the second clock signal is one in which the second clock signal leads the first supply signal by between 5% and 20% of a period of the periodically driven first supply signal.

4. The quasi-adiabatic logic gate of claim 1, wherein the phase relation between the second supply signal and the first clock signal is one in which the first clock signal leads the second supply signal by between 2% and 50% of a period of the periodically driven second supply signal.

5. The quasi-adiabatic logic gate of claim 4, wherein the phase relation between the second supply signal and the first clock signal is one in which the first clock signal leads the second supply signal by between 5% and 20% of a period of the periodically driven second supply signal.

6. The quasi-adiabatic logic gate of claim 4, wherein a difference between the first and second DC voltages is greater than two times a threshold voltage of the pullup transistors.

7. The quasi-adiabatic logic gate of claim 6, wherein a difference between the first and second DC voltages is greater than five times a threshold voltage of the pullup transistors.

8. The quasi-adiabatic logic gate of claim 4, wherein a difference between the first and second DC voltages is greater than two times a threshold voltage of the pulldown transistors.

9. The quasi-adiabatic logic gate of claim 4, wherein a difference between the first and second DC voltages is greater than five times a threshold voltage of the pulldown transistors.

10. The quasi-adiabatic logic gate of claim 1, wherein the first supply signal driving the first supply node oscillates between a first DC voltage and a second DC voltage, and wherein the second supply signal driving the second supply node oscillates between the second DC voltage and the first DC voltage.

11. The quasi-adiabatic logic gate of claim 10, wherein the pullup transistors and the pullup clocking transistors comprise PMOS transistors, each having a body node driven by a DC voltage above the first DC voltage.

12. The quasi-adiabatic logic gate of claim 10, wherein the pullup transistors and the pullup clocking transistors comprise PMOS transistors, each having a body node driven by a periodic signal having a voltage above a voltage of the first supply signal.

13. The quasi-adiabatic logic gate of claim 10 wherein the pulldown transistors and the pulldown clocking transistors comprise NMOS transistors, each having a body node driven by a DC voltage below the second DC voltage.

14. The quasi-adiabatic logic of claim 10, wherein the pulldown transistors and the pulldown clocking transistors comprise NMOS transistors, each having a body node driven by a periodic signal having a voltage below a voltage of the second supply signal.

15. The quasi-adiabatic logic gate of claim 1, wherein the first supply signal driving the first supply node oscillates between a first DC voltage and an intermediate DC voltage between the first and a second DC voltages, and wherein the second supply signal driving a second supply node oscillates between the second DC voltage and the intermediate DC voltage.

16. The quasi-adiabatic logic gate of claim 15, wherein the first and second supply signals are complementary sinusoidal signals.

17. The quasi-adiabatic logic gate of claim 1, wherein complementary first and second periodic clock signals are complementary sinusoidal signals.

18. The quasi-adiabatic logic gate of claim 1, further comprising
a clock generator having first and second output nodes, the clock generator configured to provide the first sinusoidal clock signal at the first output node and the second sinusoidal clock signal at the and second output node.

19. The quasi-adiabatic logic gate of claim 1, further comprising:
an inductor coupled between the first output node of the clock generator and the first supply node.

20. The quasi-adiabatic logic gate of claim 19, wherein the inductor is a first inductor, the quasi-adiabatic CMOS logic gate further comprising:
a second inductor coupled between the second output node of the clock generator and the second supply node.

* * * * *